(12) United States Patent
Takei et al.

(10) Patent No.: US 7,727,902 B2
(45) Date of Patent: Jun. 1, 2010

(54) COMPOSITION FOR FORMING NITRIDE COATING FILM FOR HARD MASK

(75) Inventors: Satoshi Takei, Toyama (JP); Yasushi Sakaida, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 891 days.

(21) Appl. No.: 10/584,133

(22) PCT Filed: Dec. 22, 2004

(86) PCT No.: PCT/JP2004/019225

§ 371 (c)(1),
(2), (4) Date: Oct. 23, 2006

(87) PCT Pub. No.: WO2005/064403

PCT Pub. Date: Jul. 14, 2005

(65) Prior Publication Data

US 2007/0148557 A1    Jun. 28, 2007

(30) Foreign Application Priority Data

Dec. 26, 2003  (JP) ............................. 2003-431792

(51) Int. Cl.
*H01L 21/31* (2006.01)
*H01L 21/469* (2006.01)

(52) U.S. Cl. .................. 438/758; 438/706; 438/725; 438/782; 257/E21.178; 257/E21.218; 257/E21.229; 257/E21.245; 257/E21.267; 257/E21.329; 257/E21.332

(58) Field of Classification Search .................. 438/758, 438/706, 712, 724, 744, 757, 782, 680; 257/E21.17, 257/218, 229, 245, 267, 329, 332
See application file for complete search history.

(56) References Cited

U.S. PATENT DOCUMENTS

| | | | | |
|---|---|---|---|---|
| 5,919,598 A | * | 7/1999 | Flaim et al. | 430/271.1 |
| 5,919,599 A | * | 7/1999 | Meador et al. | 430/271.1 |
| 6,156,479 A | * | 12/2000 | Meador et al. | 430/270.1 |
| 6,355,587 B1 | * | 3/2002 | Loxley et al. | 501/54 |
| 7,094,514 B2 | * | 8/2006 | Serizawa et al. | 430/126 |
| 7,190,354 B2 | * | 3/2007 | Tanaka et al. | 345/17.3 |
| 7,427,361 B2 | * | 9/2008 | Small et al. | 252/79.1 |

FOREIGN PATENT DOCUMENTS

| | | |
|---|---|---|
| EP | 0 744 662 A2 | 11/1996 |
| GB | 2 235 444 A | 3/1991 |
| JP | A 2001-53068 | 2/2001 |
| JP | A 2001-242630 | 9/2001 |
| JP | A 2003-177206 | 6/2003 |
| JP | A 2003-209046 | 7/2003 |
| JP | A 2003-312159 | 11/2003 |

* cited by examiner

*Primary Examiner*—David Nhu
(74) *Attorney, Agent, or Firm*—Oliff & Berridge, PLC

(57) ABSTRACT

There is provided an underlayer coating that causes no intermixing with photoresist layer, can be formed by a spin-coating method, and can be used as a hard mask in lithography process of manufacture of semiconductor device. Concretely, it is an underlayer coating forming composition used in manufacture of semiconductor device including metal nitride particles having an average particle diameter of 1 to 1000 nm, and an organic solvent. The metal nitride particles contain at least one element selected from the group consisting of titanium, silicon, tantalum, tungsten, cerium, germanium, hafnium, and gallium.

2 Claims, No Drawings

COMPOSITION FOR FORMING NITRIDE COATING FILM FOR HARD MASK

CROSS REFERENCE

This application is the U.S. national phase application of PCT/JP04/19225, filed Dec. 22, 2004, claiming priority from JP 2003-431792, filed Dec. 26,2003. The subject matters of these applications are incorporated herein by reference.

TECHNICAL FIELD

The present invention relates to a method for forming photoresist pattern used in manufacture of semiconductor devices comprising forming an underlayer coating containing metal nitride particles between a semiconductor substrate and a photoresist in addition, the present invention relates to an underlayer coating forming composition for forming an underlayer coating containing metal nitride particles used in formation of photoresist pattern used in manufacture of semiconductor devices. Further, the present invention relates to a method for forming an underlayer coating containing metal nitride particles by use of the underlayer coating forming composition, and an underlayer coating containing metal nitride particles formed from the underlayer coating composition.

BACKGROUND ART

Conventionally, in the manufacture of semiconductor devices, micro-processing by lithography using a photoresist has been carried out. The micro processing is a processing method comprising forming a photoresist coating on a semiconductor substrate such as a silicon wafer or the like, irradiating actinic rays such as ultraviolet rays through a mask pattern on which a pattern for a semiconductor device is depicted, developing it to obtain a photoresist pattern, and etching the substrate using the photoresist pattern as a protective film, thereby forming fine unevenness corresponding to the pattern on the surface of the substrate.

In the processing method, an organic underlayer coating being an underlayer coating comprising an organic material, such as an anti-reflective coating or a flattening costing is often formed. In this case, firstly the organic underlayer coating is removed by etching by using a photoresist pattern as a protective coating. The etching of the organic underlayer coating is generally carried out by dry etching. However, in this process not only the organic underlayer coating but also the photoresist are etched to cause a problem that the film thickness of the photoresist is reduced. Therefore, there is a tendency that organic underlayer coatings with a high removal rate by dry etching are used. However, as photoresists are composed of organic materials similarly to the organic underlayer coatings, it is difficult to suppress a decrease in film thickness of photoresists.

In recent years, the use of photoresists in a form of thin film has been considered with the progress of miniaturization in size to be processed. This is because it is supposed to occur fall of photoresist pattern or the like as aspect ratio (height/width) of photoresist pattern becomes large in case where the size of photoresist pattern is reduced without change of film thickness. In addition, photoresists are improved in resolution as the film thickness thereof becomes smaller. Consequently, it is required to use photoresists in a form of thin film. However, in case where a photoresist and an organic underlayer coating are used, there is problem that the film thickness of photoresist is reduced on removal of the organic underlayer coating as mentioned above. Thus, when photoresists in a form of thin film are used, there occurs a problem that it is not able to secure a film thickness sufficient as a protective coating (composed of a photoresist and an organic underlayer coating) for the processing of semiconductor substrate.

On the other hand, a coating composed of inorganic materials that is known as a hard mask has been used as an underlayer coating between a semiconductor substrate and a photoresist in this case, as the photoresist (organic material) is greatly different from the hard mask (inorganic material) in their constitutional components, the removal rate thereof drastically depends on the kind of gas used for dry etching. The suitable selection of the kind of the gas makes possible to remove the hard mask (underlayer coating) by dry etching without a large decrease of film thickness of the photoresist Therefore, in case where a photoresist and a hard mask are used, it is expected that it is able to secure a film thickness sufficient as a protective coating (composed of a photoresist and a hard mask) for the processing of semiconductor substrate even the photoresist is in a form of thin film.

Conventionally, hard masks are formed by a vapor deposition method by use of a CVD apparatus, a vacuum vapor deposition apparatus, and a sputtering apparatus, etc. On the contrary, photoresists and organic underlayer coatings are formed by application with a spin-coating apparatus or the like on a semiconductor substrate and then baking (hereinafter, referred to as "spin-coating method"). The spin-coating method is simple from viewpoint of apparatus used or the like compared with the vapor deposition method. Therefore, there are demands for hard masks that can be formed by a spin-coating method not a vapor deposition method. In the meantime, some underlayer coatings containing Inorganic materials are known (see, for example Patent Documents 1, 2 and 3).

Patent Document 1: JP-A-2001-3068 (2001)
Patent Document 2: JP-A-2001-242630 (2001)
Patent Document 3: JP-A-2003-177206 (2003)

DISCLOSURE OF INVENTION

Problem to be Solved by the Invention

The present invention was made taking the present status as mentioned above into account An object of the present invention is to provide an underlayer coating forming composition for forming a hard mask by a spin coating method. In addition, another object of the present invention is to provide an underlayer coating that can be formed by a spin-coating method, and causes no intermixing with a photoresist applied and formed as an upper layer. Further, an object of the present invention is to provide an underlayer coating that can be formed by a spin-coating method and can be used for an underlayer anti-reflective coating for reducing reflection of exposure irradiation light from a semiconductor substrate to a photoresist layer formed on the substrate, a flattening coating for flattening a semiconductor substrate having unevenness, and a coating for preventing contamination of a photoresist layer due to substances generated from a semiconductor substrate on baking under heating, and the like. And, another object of the present invention is to provide a method for forming underlayer coating for photography by use of the underlayer coating forming composition, and a method for forming a photoresist pattern.

Means for Solving the Problem

The present invention relates to the following aspects:

as a first aspect, an underlayer coating forming composition used in manufacture of semiconductor devices, comprising metal nitride particles having an average particle diameter of 1 to 1000 nm, and an organic solvent;

as a second aspect, an underlayer coating forming composition used in manufacture of semiconductor devices, comprising metal nitride particles having an average particle diameter of 1 to 1000 nm, an organic maternal, and an organic solvent;

as a third aspect, the underlayer coating forming composition as described in the first or second aspect, wherein the metal nitride particles contain at least one element selected from the group consisting of titanium, silicon, tantalum, tungsten, cerium, germanium, hafnium, and gallium;

as a fourth aspect, the underlayer coating forming composition as described in the first or second aspect, wherein the metal nitride particles are particles of at least one metal nitride selected from the group consisting of titanium nitride, titanium oxynitride, silicon nitride, silicon oxynitride, tantalum nitride, tantalum oxynitride, tungsten nitride, tungsten oxynitride, cerium nitride, cerium oxynitride, germanium nitride, germanium oxynitride, hafnium nitride, hafnium oxynitride, cesium nitride, cesium oxynitride, gallium nitride and gallium oxynitride, as a fifth aspect, the underlayer coating forming composition as described in the second aspect, wherein the organic material is at least one component selected from the group consisting of polymers, crosslinking compounds and light absorbing compounds;

as a sixth aspect, a method for forming underlayer coating for use in manufacture of semiconductor device, comprising coating the underlayer coating forming composition as described in any one of the first to fifth aspects on a semiconductor substrate, and baking it;

as a seventh aspect, the method for forming underlayer coating as described in the sixth aspect, wherein the backing is carried out under a condition of a baking temperature of 80 to 300° C. and a baking time of 0.5 to 10 minutes;

as an eighth aspect, an underlayer coating for use in manufacture of semiconductor device, formed by coating the underlayer coating forming composition as described in any one of the first to fifth aspects on a semiconductor substrate, and baking it under a condition of a baking temperature of 80 to 300° C. and a baking time of 0.5 to 10 minutes;

as a ninth aspect, a method for forming photoresist pattern for use in manufacture of semiconductor device, comprising coating the underlayer coating forming composition as described in any one of the first to fifth aspects on a semiconductor substrate, and baking it to form an underlayer coating, forming a photoresist layer on the underlayer coating, exposing the semiconductor substrate covered with the underlayer coating and the photoresist layer to light and developing the photoresist layer after the exposure to light; and as a tenth aspect, the method for forming photoresist pattern as described in the ninth aspect, in which the exposure to light is carried out with a light of a wavelength of 248 nm, 193 nm or 157 nm.

EFFECT OF THE INVENTION

The present invention relates to an underlayer coating forming composition for forming an underlayer coating that contains metal nitride particles. The present invention can provide an underlayer coating that causes no intermixing with photoresists and has a low dry etching rate.

The underlayer coating containing metal nitride particles obtained according to the present invention makes the processing of semiconductor substrate in dry etching process easy. In addition, the use of underlayer coating containing metal nitride particles obtained according to the present invention can suppress a decrease in film thickness of photoresists when the underlayer coating is removed by dry etching.

Best Mode for Carrying out the Invention

The underlayer coating forming composition of the present invention comprises metal nitride particles and an organic solvent. In addition, the underlayer coating forming composition of the present invention can contain other inorganic particles such as carbon particles, silicon oxide particles, and titanium oxide and the like.

The proportion of the solid content in the underlayer coating forming composition of the present Invention is for example 0.1 to 70 mass %, or 0.5 to 50 mass %, or 1 to 40 mass %, or 10 to 30 mass %. In this specification, the solid content means all components in the underlayer coating forming composition from which the organic solvent component is excluded.

In case where the metal nitride particles and the organic material are used in the underlayer coating forming composition of the present invention, the content of the metal nitride particles is for example 40 to 99.9 mass %, for example 50 to 99.6 mass %, or 60 to 99 mass %, or 70 to 90 mass % in the solid content, and that of the organic material is for example 0.1 to 60 mass %, for example 0.5 to 50 mass %, or 1 to 40 mass %, or 10 to 30 mass % in the solid content.

In case where the underlayer coating forming composition of the present invention contains other inorganic particles such as carbon particles, silicon oxide particles, and titanium oxide and the like, the content thereof Is 30 mass % or less, or 20 mass % or less in the solid content The metal nitride particles contained in the underlayer coating forming composition of the present include for example titanium nitride, titanium oxynitride, silicon nitride, silicon oxynitride, tantalum nitride, tantalum oxynitride, tungsten nitride, tungsten oxynitride, cerium nitride, cerium oxynitride, germanium nitride, germanium oxynitride, hafnium nitride, hafnium oxynitride, cesium nitride, cesium oxynitride, gallium nitride and gallium oxynitride, etc. The particles of titanium nitride, titanium oxynitride, silicon nitride and silicon oxynitride are preferable.

The particle diameter of the metal nitride particles used is not specifically limited so far as the composition containing the particles can form an underlayer coating on a semiconductor substrate, but the average particle diameter is 1000 nm or less preferably 1 nm to 1000 nm, particularly preferably 1 nm to 100 nm. In this case, when the average particle diameter is more than 1000 nm, It takes a long time to remove the underlayer coating by etching. In addition, flatness of the underlayer coating is vitiated. Further, dispersion property of the particles in the solvent is lowered to cause particle precipitation, thereby shelf stability of the underlayer coating forming composition becomes insufficient The average particle diameter is calculated as follows: metal nitride particles are applied on a semiconductor substrate and dried, and then the size (diameter) of 20 particles is measured with a scanning electron microscope (SEM), and the average particle diameter is determined as an average value thereof. In the meantime, when the particles are elliptical forms or the like, the average value of the major axis and the minor axis is regarded as the size of the particle.

In the underlayer coating forming composition of the present invention, there are cases where only one kind of these metal nitride particles is used or two kinds or more thereof are used together.

In the underlayer coating forming composition of the present Invention, the organic material is not specifically limited. The organic material that has been conventionally used for coatings provided as underlayers of photoresist can be used. That is, organic materials for anti-reflective coatings, or organic materials for flattening and organic materials for barrier layers, and the like can be used.

The organic materials include for example polymers, crosslinking compounds, light absorbing compounds, surfactants, polymer dispersants, crosslink-catalysts, adhesion auxiliaries, and rheology controlling agents, etc. that can be used in a suitable combination. In addition, the content thereof can be suitably selected.

The kind of the polymers used as organic materials is not specifically limited. The polymers that can be used include polyesters, polystyrenes, polyimides, acrylic polymers, methacyrlic polymers, polyvinyl ethers, phenol novolak, naphthol novolak, polyethers, polyamides, polycarbonates and the like. It is preferable to use polymers containing aromatic ring structure such as benzene ring, naphthalene ring, anthracene ring, triazine ring, quinoline ring, and quinoxaline ring, or the like that acts as a light absorbing moiety.

Such polymers include for example addition polymerization polymers containing as structural units addition polymerizable monomers such as benzyl acrylate, benzyl methacrylate, phenyl acrylate, naphthyl acrylate, anthryl methacrylate, anthrylmethyl methacrylate, strene, hydroxystyrene, benzyl vinyl ether, N-phenyl maleimide and the like, and polycondensation polymers such as phenol novolak. naphthol novolak and the like. In addition, polymers produced from a triazine compound (trade name: Cymel 303, Cymel 1123) disclosed in U.S. Pat. No. 6,323,310 can be mentioned.

Further, polymers containing at least one of the following structural units (a) to (e) can be mentioned. The polymers can be produced by reference to for example U.S. Pat. Nos. 5,919,598, 5,919599 and 6,156,479.

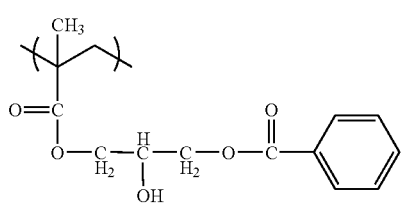

(a)

-continued

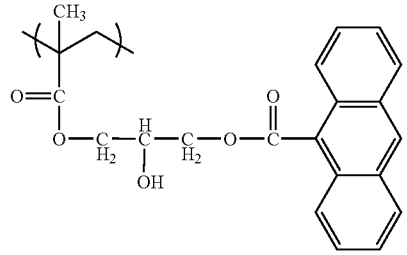

(b)

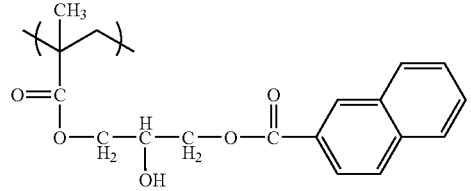

(c)

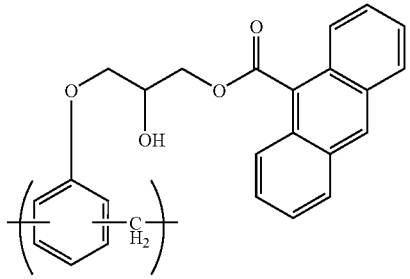

(d)

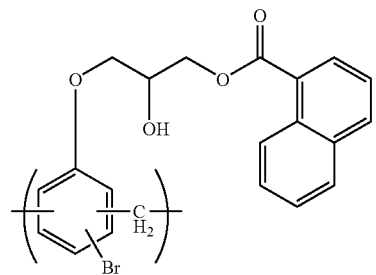

(e)

In addition, polymers containing no aromatic ring structure can be used. Such polymers include for example addition polymerization polymers containing as structural units only addition polymerizable monomers containing no aromatic ring structure such as alkylacrylate, alkymethacrylate, vinyl ether, alkyl vinyl ether, acrylonitrile, maleimide, N-alkylmaleimide, maleic anhydride and the like.

When the addition polymerization polymers are used as polymers, the polymers may be monopolymers or copolymers. For the production of the addition polymerization polymers, addition polymerizable monomers are used. The addition polymerizable monomers include acrylic acid, methacrylic acid, an acrylate compound, a methacrylate compound, an acrylamide compound, methacrylamide compound, a vinyl compound, a styrene compound, a maleimide compound, maleic anhydride, acrylonitrile and the like.

The acrylate compound includes methyl acrylate, ethyl acrylate, n-hex acrylate, isopropyl acrylate, cyclohexyl acrylate, benzyl acrylate, phenyl acrylate, anthrylmethyl acrylate, 2-hydroxyethyl acrylate, 3-chloro 2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxy silane, glycidyl acrylate and the like.

The methacrylate compound includes methyl methacrylate, ethyl methacrylate, n-hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy6-hydroxynorbornene-2-carboxylic-6lactone, 3-methacryloxypropyltriethoxy silane, glycidyl methacrylate, 2-phenylethyl methacrylate, hydroxyphenyl methacrylate, bromophenyl methacrylate and the like.

The acrylamide compound includes acrylamide, N-methyl acrylamide, N-ethyl acrylamide, N-benzyl acrylamide, N-phenyl acrylamide, N,N-dimethyl aclylamide, N-anthryl acrylamide and the like.

The methacrylamide compound includes methacrylamide, N-methyl methacrylamide, N-ethyl methacrylamide, N-benzyl methacrylamide, N-phenyl methacrylamide, N,N-dimethyl methacrylamide, N-anthryl methacrylamide and the like.

The vinyl compound includes vinyl alcohol, 2-hydroxyethyl vinyl ether, methyl vinyl ether, ethyl vinyl ether, benzyl vinyl ether, vinyl acetate, vinyl trimethoxy silane, 2-chloroethyl vinyl ether, 2-methoxyethyl vinyl ether, vinyl naphthalene, vinyl anthracene and the like.

The styrene compound includes styrene, hydroxy styrene, chloro styrene, bromo styrene, methoxy styrene, cyano styrene, acetyl styrene and the like.

The maleimide compound includes maleimide, N-methyl maleimide, N-phenyl maleimide, N-cyclohexyl maleimide, N-benzyl maleimide, N-hydroxyethyl maleimide and the like.

The polycondensation polymers used as the organic material in the present invention include for example a condensation polymerized polymer of a glycol compound with a dicarboxylic acid compound. The glycol compound includes diethylene glycol, hexamethylene glycol, butylene glycol and the like. The dicarboxylic acid compound includes succinic acid, adipic acid, terephthalic acid, maleic anhydride and the like. In addition, for example polyester, polyamide or polyimide such as polypyromellitic imide, poly(p-phenyleneterephathalic amide), polybutylene terephthalate, polyethylene terephthalate and the like may be mentioned.

The molecular weight of the polymer used as the organic material in the underlayer coating forming composition according to the present invention is for example 1000 to 1000000 in the terms of weight average molecular weight, or 3000 to 300000, or for example 5000 to 200000, or 10000 to 100000.

As the crosslinking compound used as the organic material in the underlayer coating forming composition according to the present invention, the kind thereof is not specifically limited. The crosslinking compound Includes a melamine compound, a substituted urea compound, a polymer type crosslinking compound having epoxy groups, and the like. Preferably, the crosslinking compounds include nitrogen-containing compounds having two or more nitrogen atoms substituted with hydroxymethyl group or alkoxymethyl group. They are nitrogen-containing compounds having two or more nitrogen atoms substituted with hydroxymethyl group, methoxymethyl group, ethoxymethyl group, butoxymethyl group, and hexyloxymethyl group, or the like.

The concrete compounds include nitrogen-containing compounds such as hexamethoxymethyl melamine, tetramethoxymethyl benzoguanamine, 1,3,4,6-tetrakis(butoxymethyl)glycoluril, 1,3,4,6-tetrakis(hydroxymethyl) glycoluril, 1,3-bis(hydroxymethyl)urea, 1,1,3,3-tetrakis (butoxymethyl)urea, 1,1,3,3-tetrakis(methoxymethyl)urea, 1,3-bis(hydroxymethyl)-4,5-dihydroxy-2-imidazolinone, and 1,3-bis(methoxymethyl)-4,5-dimethoxy-2-imidazolinone, etc. The crosslinking compounds that can be used also include commercially available compounds such as methoxymethyl type melamine compounds manufactured by Mitsui Cytec Co., Ltd. (trade name: Cymel 300, Cymel 301, Cymel 303, Cymel 350), butoxymethyl type melamine compounds (trade name: Mycoat 508, Mycoat 508), glycoluril compounds (trade name: Cymel 1170, Powderlink 1174), methylated urea resins (trade name: UFR 65), butylated urea resins (trade name: UFR300, U-VAN 10S60, U-VAN 10R, U-VAN 11HV), urea/formaldehyde resins manufactured by Dainippon Ink and Chemistry Incorporated (highly condensed type, trade name: Beckamine J-300S, Beckamine P955, Beckamine N) and the like.

In addition, the crosslinking compounds that can be used include polymers produced by use of acrylamide compounds or methacrylamide compounds substituted with hydroxymethyl group or alkoxymethyl group, such as N-hydroxymethylacrylamide, N-methoxymethylmethacrylamide, N-ethoxymethylacrylamide, and N-butoxymethylmethacrylamide, etc. Such polymers include for example poly(N-butoxymethylacrylamide), a copolymer of N-butoxymethylacrylamide with styrene, a copolymer of N-hydroxymethylmathacrylamide with methylmethacrylate, a copolymer of N-ethoxymethymethacrylamide with benzylmethacrylate, and a copolymer of N-butoxymethylacrylamide, benzylmethacrylate and 2-hydroxypropylmethacrylate, and the like.

As the light absorbing compound used as the organic material in the underlayer coating forming composition according to the present invention, the kind thereof is not specifically limited.

The selection of the kind and blending amount of the light absorbing compound makes possible to control characteristics such as refractive index, attenuation coefficient and the like of the underlayer coating formed from the underlayer coating forming composition according to the present invention. As the light absorbing compound, are preferably used compounds having a high absorption for light at photosensitive characteristic wavelength region of photosensitive components in a photoresist layer provided on the underlayer coating. The light absorbing compound can be used singly or in a combination of two or more.

As the light absorbing compounds, can be used phenyl compounds, benzophenone compounds, benzotriazole compounds, azo compounds, naphthalene compounds, anthracene compounds, anthraquinone compounds, triazine compounds, triazine trione compounds, quinoline compounds and the like. Phenyl compounds, naphthalene compounds, anthracene compounds, triazine compounds, triazine trione compounds and the like can be used.

As the light absorbing compounds, can be preferably used phenyl compounds having at least one hydroxy group, amino group or carboxyl group, naphthalene compounds having at least one hydroxy group, amino group or carboxyl group, or anthracene compounds having at least one hydroxy group, amino group or carboxyl group.

The phenyl compounds having at least one hydroxy group, amino group or carboxyl group include phenol, bromophenol, 4,4'-sulfonyldiphenol, tert-butylphenol, biphenol, benzoic acid, salicylic add, hydroxyisophthalic acid, phenylacetic acid, aniline, benzyl amine, benzyl alcohol, cinnamyl alcohol, phenylalanine, phenoxypropanol, and the like.

The naphthalene compounds having at least one hydroxy group, amino group or carboxyl group include 1-naphthalene carboxylic acid, 2-naphthalene carboxylic acid, 1-naphthol, 2-naphthol, 1-aminonaphthalne, naphthylacetic acid, 1-hydroxy-2-naphthalene carboxylic acid, 3-hydroxy-2-naphthalene carboxylic acid, 3,7-dihydroxy-2-naphthalene carboxylic acid, 6bromo-2-hydroxynaphthalene, 2,6-naphthalene dicarboxylic acid and the like.

The anthracene compounds having at least one hydroxy group, amino group or carboxyl group include 9-anthracene carboxylic acid, 9-hydroxymethylanthracene, 1-aminoanthracene and the like.

Further, as the light absorbing compound, triazine trione compounds are also used. The triazine trione compounds Include the compounds of formula (1):

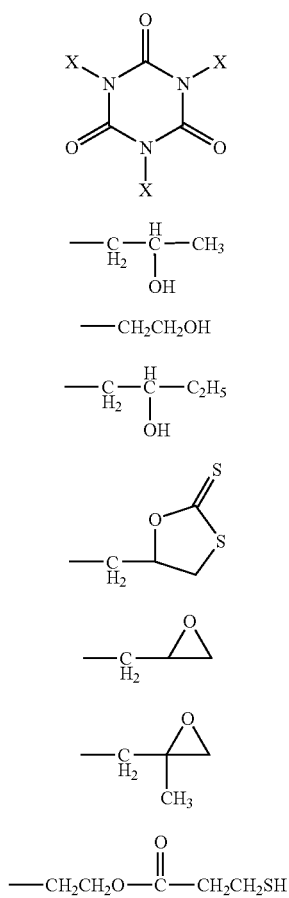

In the formula, X is a group of (f) to (l).

As the crosslink-catalyst used as an organic material for the underlayer coating forming composition of the present invention, acid compounds or acid generators can be mentioned.

The acid compounds include acid compounds such as p-toluene sulfonic acid, trifluoromethane sulfonic acid, pyridinium-p-toluenesulfonate, salicylic acid, camphor sulfonic acid, sulfosalicylic acid, citric acid, benzoic acid, and hydroxy benzoic acid, etc. In addition, as the acid compounds, aromatic sulfonic acid compounds can be used. Concrete examples of the aromatic sulfonic acid compounds are p-toluene sulfonic acid, pyridinium-p-toluenesulfonate, sulfosalicylic acid, 4-chlorobenzenesulfonic acid, 4-hydroxybenzenesulfonic acid, benzenedisulfonic acid, 1-naphthalenesulfonic acid, and pyridinium-1-naphthalenesulfonic acid, etc. The acid generators include 2,4,4,6-tetrabromocyclohexadienone, 2-nitrobenzyltosylate, bis(4-tert-butylphenyl) iodonium trifluoromethanesulfonate, triphenylsulfonium trifluoramethanesulfonate, phenyl-bis(trichloromethyl)-s-trazine, benzointosylate, and N-hydroxysuccinimide trifluoromethanesulfonate, and the like. The acid compounds and acid generators can be used singly or in a combination of two or more.

The polymer dispersants used as an organic material for the underlayer coating forming composition of the present invention include for example polyoxyethylene alkyl ethers, polyoxyethylene alkyl phenyl ethers, ethylene glycol diesters, ethylene oxide-addition products of sorbitol, propylene oxide-addition products of sorbitol, ethylene oxide/propylene oxide-mixed addition products of sorbitol, ethylene oxide-addition products of polyethylenepolyamine, propylene oxide-addition products of polyethylenepolyamine, ethylene oxide/propylene oxide-mixed addition products of polyethylenepolyamine, ethylene oxide-addition products of nonylphenyl ether formalin condensation product, poly(meth)acrylates, copolymer salts of a carboxy group containing unsaturated monomer with other vinyl compound, partial alkyl esters of poly(meth)acrylic acid and salts thereof, polystyrene sulfonates, formalin condensation products of naphthalene sulfonate, polyalkylene polyamines, sorbitan fatty acid esters, fatty acid modified polyesters, polyamides, tertiary amino modified polyurethanes, and tertiary amine modified polyesters, and the like. These compounds can be used singly or in a combination of two or more.

The surfactants used an organic material for the underlayer coating forming composition of the present Invention Include for example, nonionic surfactants such as polyoxyethylene alkyl ethers, e.g., polyoxyethylene lauryl ether, polyoxyethylene stearyl ether, polyoxyethylene oleyl ether, etc., polyoxyethylene alkyl allyl ethers, e.g., polyoxyethylene octyl phenol ether, polyoxyethylene nonyl phenol ether, etc.; polyoxyethylene/polyoxypropylene block copolymers, sorbitan fatty acid esters, e.g., sorbitan monolaurate, sorbitan monopalmitate, sorbitan monostearate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan tristearate, etc.; fluorine based surfactants, e.g., trade name: EFTOP EF301, EF303, EF352 (manufactured by Tochem Products Co., Ltd.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The blending amount of the surfactants is usually 0.5 mass % or less, preferably 0.2 mass % or less in the solid content of the underlayer coating forming composition. The surfactants may be added singly or in combination of two or more.

The adhesion auxiliaries used an organic material for the underlayer coating forming composition of the present invention include for example, chlorosilanes such as trimethylchlorosilane, dimethylvinylchlorosilane, chloromethyldimethyl chlorosilane and the like, alkoxysilanes such as trimethylmethoxysilane, dimethyldiethoxysilane, dimethylvinylethoxysilane, γ-methacryloxypropyltrimethoxysilane, diphenyldimethoxysilane and the like, silazanes such as hexamethyldisilazane, N,N'-bis(trimethylsilyl)urea, dimethyltrimethylsilylamine, trimethylsilylimidazole and the like, silanes such as γ-chloropropyltrimethoxysilane, γ-aminopropyltriethoxysilane, γ-glycidoxypropyltrimethoxysilane, γ-methacryloxypropyltrimethoxysilane and the like, heterocyclic compounds such as benzotriazole, benzimidazole, indazole, imidazole, 2-mercaptobenzimidazole, 2mercaptobenzoxazole, urazole, thiouracyl, mercaptopyrimidine and the like, urea compounds such as 1,1-dimethylurea, 1,3-dimethylurea and the like.

The rheology controlling agents used an organic material for the underlayer coating forming composition of the present invention include for example, phthalic acid derivatives such as dimethyl phthalate, diethyl phthalate, diisobutyl phthalate, butyl isodecyl phthalate and the like, adipic acid derivatives such as di-n-butyl adipate, diisooctyl adipate, octyldecyl adipate and the like, maleic acid derivatives such as di-n-butyl maleate, diethyl maleate, dinonyl maleate and the like, oleic acid derivatives such as methyl oleate, butyl oleate, tetrahydrofurfuryl oleate and the like, stearic acid derivatives such as n-butyl stearate, and glyceryl stearate, and the like.

It is preferable to use the organic material for the underlayer coating forming composition of the present invention in a combination with the polymer and the crosslinking compound. In this case, the proportion of the polymer in the organic material is 20 to 90 mass %, or 30 to 60 mass %, and the proportion of the crosslinking compound is 10 to 80 mass %, or 40 to 70 mass %.

Further, it is preferable to use the organic material for the underlayer coating forming composition of the present invention in a combination with the polymer, the crosslinking compound and the crosslink-catalyst. In this case, the proportion of the polymer in the organic material is 20 to 90 mass %, or 30 to 60 mass %, the proportion of the crosslinking compound is 5 to 75 mass %, or 30 to 65 mass %, and the proportion of the crosslink-catalyst is 0.1 to 5 mass %, or 0.5 to 3 mass %.

The organic solvent in the underlayer coating forming composition of the present invention is not specifically limited. For example, the solvents that can be used include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether, propylene glycol propyl ether acetate, toluene, xylene, methyl ethyl ketone, cyclopentanone, cydohexanone. ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3methoxypropionate, ethyl 3-ethoxypropionate, methyl 3-ethoxypropionate, methyl pyruvate, ethyl pyruvate, ethyl acetate, butyl acetate, ethyl lactate, butyl lactate, N-dimethylformamide, N-dimethylacetamide, dimethylsulfoxide, and N-methylpyrrolidone, etc. These organic solvents may be used singly or in combination of two or more of them.

Hereinafter, the utilization of the underlayer coating forming composition of the present invention is described.

The underlayer coating forming composition of the present invention is coated on a substrate used for manufacture of semiconductor devices (for example, silicon wafer substrate, silicon/silicon dioxide coat substrate, silicon nitride substrate, glass substrate, silicon wafer, ITO substrate, polyimide substrate, low dielectric constant material (low-k material) coat substrate or the like) by a suitable coating method, for example, with a spin-coating apparatus, a coater apparatus or the like, and thereafter the substrate is baked to fabricate an underlayer coating. The conditions of baking are suitably selected from baking temperature of 80 to 300° C. or 150 to 250° C. and baking time of 0.5 to 10 minutes or 1 to 5 minutes. The film thickness of the underlayer coating is for example 1 to 1000 nm, or 10 to 500 nm, or 50 to 100 nm.

Next, a photoresist layer is formed on the underlayer coating. The film thickness of the photoresist is 50 to 10000 nm. The photoresist to be coated and formed on the underlayer coating of the present invention is not specifically limited, and any of negative type and positive type photoresists can be used. The photoresist includes a positive type photoresist consisting of a novolak resin and 1,2-naphthoquinone divide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist For example, trade name: APAE-X manufactured by Shipley Company, trade name: PAR710 manufactured by Sumitomo Chemical Co., Ltd., and trade name: SEPR430 manufactured by Shinetsu Chemical Co., Ltd., and the like can be mentioned.

Subsequently, the substrate covered with the underlayer coating containing metal nitride particles and the photoresist layer is exposed to light such as i-line, KrF excimer laser beam, ArF excimer laser beam or F2 excimer laser beam, etc. through a predetermined mask After the exposure, post exposure bake is performed, If necessary, and then development is conducted by use of a developer such as an alkaline aqueous solution to remove partly photoresist according to the predetermined pattern.

The developer for photoresists includes for example an aqueous solutions of alkali metal hydroxide such as potassium hydroxide, sodium hydroxide or the like, aqueous solution of quaternary ammonium hydroxide such as tetramethylammonium hydroxide, tetramethylammonium hydroxide, choline or the like, amine aqueous solution such as ethanolamine, propylamine, ethylenediamine or the like. As the developer, 2.38 mass % tetramethylammonium hydroxide aqueous solution that is universally utilized can be used. Further, surfactants can be added in these developers. The condition of development is suitably selected from temperature of 5 to 50° C. and time of 0.1 to 5 minutes.

Then, the part of the underlayer coating corresponding to the removed part of the photoresist is removed by dry etching, thereby the semiconductor substrate is exposed. It is preferable to use chlorine-containing gas for the dry etching. In the dry etching by use of chlorine-containing gas, photoresists (organic material) are difficult to be removed while the underlayer coating (inorganic material) of the present invention is rapidly removed. This permits use of photoresists in a form of thin film.

The dry etching may be conducted by use of a gas such as tetrafluoromethane, perfluorocyclobutane ($C_4F_8$), perfluoropropane ($C_3F_8$), trifluoromethane, carbon monoxide, argon, hydrogen nitrogen, ammonia, oxygen, sulfur hexafluoride, difluoromethane, nitrogen trifluoride and chlorine trifluoride, etc. together with the chlorine-containing gas.

Then, processing of the semiconductor substrate is conducted by using a coating composed of the patterned photoresist and underlayer coating as a protective coating. It is preferable to conduct the processing of the semiconductor substrate by dry etching with fluorine-containing gas such as tetrafluoromethane or the like. This is because the underlayer coating of the present invention is a hard mask and thus is difficult to be removed by dry etching with fluorine-containing gas.

In addition, an anti-reflective coating layer may be applied and formed as an upper coating of the underlayer coating of the present invention prior to the application and formation of photoresist. The anti-reflective coating composition used in such a case is not specifically limited, and can be arbitrarily selected from those conventionally used in the prior lithography process, and used. In addition, the anti-reflective coating can be formed by coating by the conventional method, for example, with a spinner or a coater, and baking. The anti-reflective coating composition includes for example one containing as main components a right absorbing compound, a resin and a solvent, one containing as main components a resin having a light absorbing group through chemical bond, a crosslinking agent and a solvent, one containing as main components a light absorbing compound, a crosslinking agent and a solvent, and one containing as main components a polymer type crosslinking agent having a light absorbing property and a solvent, and the like. The anti-reflective coating composition may contain an acid component, an acid generator component, a rheology controlling agent, or the like, if necessary. The light absorbing compounds that can be used are any compounds having a high absorption for light at photosensitive characteristic wavelength region of the photosensitive component in the photoresist provided on the anti-reflective coating, and include for example benzophenone compounds, benzotriazole compounds, azo compounds, naphthalene compounds, anthracene compounds, anthraquinone compounds, triazine compounds, and the like. The resins include polyesters, polyimides, polystyrenes, novolak resins, polyacetal resins, acrylic resins, and the like. The resins having a light absorbing group through chemical bond include resins having a right absorbing aromatic ring structure such as anthracene ring, naphthalene ring, benzene ring, quinoline ring, quinoxaline ring or thiazole ring.

The underlayer coating containing metal nitride particles formed from the underlayer coating forming composition of the present invention may contain an absorption for light used in the lithography process. In such a case, the underlayer coating can be used as a layer having a preventive effect against light reflected from the substrate. Further, the underlayer coating of the present invention can be used as a layer for preventing an interaction between the substrate and the photoresist, as a layer having a function that prevents an adverse effect against the substrate by the material used for the photoresist or by substances formed on exposure to light of the photoresist, and as a layer having a function that prevents diffusion and adverse effects of substances formed in the substrate on baking under heating to the upper layer photoresist.

Hereinafter, the present invention will be described based on examples but the present invention is not limited thereto.

EXAMPLES

Synthetic Example 1

In 27.91 g of propylene glycol monomethyl ether, 20.93 g of 2-hydroxypropyl methacrylate and 6.98 g of benzyl methacrylate were dissolved, nitrogen was passed into the resulting reaction solution for 30 minutes, and then the temperature was raised to 70° C. While the reaction solution was kept at 70° C., 0.3 g of azobisisobutyronitrile was added therein, and the solution was stirred at 70° C. for 24 hours under atmosphere of nitrogen to obtain a solution of a copolymer of 2-hydroxypropyl methacrylate with benzyl methacrylate. GPC analysis of the resulting polymer revealed that the polymer had a weight average molecular weight of 15000 (in terms of standard polystyrene).

Synthetic Example 2

In 30 g of ethyl lactate, 30 g of 2-hydroxyethyl acrylate was dissolved, nitrogen was passed into the resulting reaction solution for 30 minutes, and then the temperature was raised to 70° C. While the reaction solution was kept at 70° C., 0.3 g of azobisisobutyronitrile was added therein, and the solution was stirred at 70° C. for 24 hours under atmosphere of nitrogen to obtain a solution of poly(2-hydroxyethyl acrylate). GPC analysis of the resulting polymer revealed that the polymer had a weight average molecular weight of 9800 (on terms of standard polystyrene).

Example 1

After 2.7 g of titanium oxynitride particles (average particle diameter: 100 nm, manufactured by Ulvac Corporation Center) were dispersed in 7 g of propylene glycol monomethyl ether acetate, 0.3 g of polyoxyethylene sorbitan monolaurate was added therein. Thereafter, the resulting solution was filtered through a micro filter made of polyethylene having a pore diameter of 5 μm to prepare an underlayer coating forming composition solution.

Example 2

In 7.5 g of a solution of propylene glycol monomethyl ether acetate in which titanium oxynitride particles (average particle diameter: 100 nm, manufactured by Ulvac Corporation Center) was contained in 30 mass %, 5 g of a solution containing 0.75 g of the polymer obtained in Synthetic Example 1, 1.15 g of hexamethoxymethylmelamine, 0.012 g of pyridinium-p-toluene sulfonic acid, 0.77 g of propylene glycol monomethyl ether and 8.66 g of dimethylsufoxide were added to obtain 30 mass % solution. Thereafter, the solution was filtered through a micro filter made of polyethylene having a pore diameter of 0.2 μm to prepare an underlayer coating forming composition solution.

Comparative Example 1

In 10 g of a solution containing 5 g of the polymer obtained in Synthetic Example 1, 1.15 of hexamethoxymethylmelamine, 0.012 g of pyridinium-p-toluene sulfonic acid, 0.77 g of propylene glycol monomethyl ether and 8.66 g of dimethylsufoxide were added to obtain 30 mass % solution. Thereafter, the solution was filtered through a micro filter made of polyethylene having a pore diameter of 0.05 μm to prepare an underlayer coating forming composition solution containing no metal nitride particles.

Comparative Example 2

In 10 g of a solution containing 5 g of the polymer obtained in Synthetic Example 2, 1.15 of hexamethoxymethylmelamine, 0.012 g of pyridinium-p-toluene sulfonic acid, 0.77 g of propylene glycol monomethyl ether and 8.66 g of dimethylsufoxide were added to obtain 30 mass % solution. Thereafter, the solution was filtered through a micro filter made of polyethylene having a pore diameter of 0.05 μm to prepare an underlayer coating forming composition solution containing no metal nitride particles.

Dissolution Test in Photoresist Solvent

The underlayer coating forming composition solutions obtained in Examples 1 and 2 were coated on silicon wafer substrates by means of a spinner, respectively. The coated silicon wafer substrates were baked at 205° C. for 1 minute on a hot plate to form underlayer coatings (film thickness 460 nm). The underlayer coatings were dipped in ethyl lactate and propylene glycol monomethyl ether that are solvents used for photoresists, and as a result it was confirmed that the resulting underlayer coatings were insoluble in these solvents.

Test of Intermixing with Photoresist

The underlayer coating forming composition solutions obtained in Examples 1 and 2 were coated on silicon wafer substrates by means of a spinner, respectively. The coated silicon wafer substrates were baked at 205° C. for 5 minutes on a hot plate to form underlayer coatings (film thickness 450 nm). On each underlayer coating was coated a commercially available photoresist solution (trade name: APEX-E manufactured by Shipley Company, or the like) by means of a spinner. The coated wafers were heated at 90° C. for 1 minute on a hot plate to form photoresist layers. After exposure of the photoresists to light, post exposure bake was performed at 90° C. for 1.5 minute. After developing the photoresists, the film thickness of the underlayer coatings was measured and it was confirmed that no intermixing occurred between the underlayer coating and the photoresist.

Measurement of Dry Etching Rate

The underlayer coating forming composition solutions prepared in Examples 1 and 2 as well as Comparative Examples 1 and 2 were coated on silicon wafer substrates by means of a spinner, respectively. The coated silicon wafer substrates were baked at 205° C. for 5 minute on a hot plate to form underlayer coatings (film thickness 450 nm of each coating). Then, dry etching rate on these underlayer coatings was measured with RIE system ES401 manufactured by Nippon Scientific Co., Ltd. under the condition in which $CF_4$ was used as dry etching gas. The dry etching rate was calculated as reduction in the film thickness of underlayers per unit time.

The results are shown inn Table 1. The selectivity corresponds to dry etching rate of an underlayer coating in case where the dry etching rate of the photoresist is regarded as 1.00. In addition, in the table, A1 is a copolymer of 2-hydroxypropyl methacrylate with benzyl methacrylate, A2 is poly(2-hydroxyethyl)acrylate, and B1 is titanium oxynitride.

TABLE 1

|   | Polymer | Metal Nitride Particle | Selectivity |
| --- | --- | --- | --- |
| Example 1 | None | B1 | 0.22 |
| Example 2 | A1 | B1 | 0.49 |
| Comparative Example 1 | A1 | None | 1.00 |
| Comparative Example 2 | A2 | None | 1.33 |

It was confirmed that the etching rate of the underlayer coatings containing metal nitride particles obtained from the underlayer coating forming compositions of Examples 1 and 2 became low compared with the underlayer coating containing no metal nitride particles of Comparative Example 1. it became clear that the introduction of metal nitride particles provides metal nitride particles-containing underlayer coatings having a low etching rate regardless of whether or not any polymer is present The metal nitride particles-containing underlayer coating is required to have a lower dry etching rate than a photoresist owing to the following reasons: in the process in which the semiconductor base substrate is processed by dry etching after development of the photoresist formed on the underlayer coating, it makes possible to use a photoresist in a form of thinner film and the pattern can be transferred to a substrate accurately because the metal nitride particles-containing underlayer coating has a lower dry etching rate than the semiconductor base processing substrate.

The invention claimed is:

1. A method for forming an underlayer coating for use in manufacture of a semiconductor device, comprising:
    coating an underlayer coating forming composition on a semiconductor substrate, wherein the underlayer coating forming composition comprises metal nitride particles having an average particle diameter of 1 to 1000 nm, and an organic solvent; and
    baking the coated semiconductor substrate under a condition of a baking temperature of 80 to 300° C. and a baking time of 0.5 to 10 minutes.

2. An underlayer coating for use in manufacture of a semiconductor device, formed by
    coating an underlayer coating forming composition on a semiconductor substrate, wherein the underlayer coating forming composition comprises metal nitride particles having an average particle diameter of 1 to 1000 nm, and an organic solvent; and
    baking the coated semiconductor substrate under a condition of a baking temperature of 80 to 300° C. and a baking time of 0.5 to 10 minutes.

* * * * *